(12) United States Patent
Shin

(10) Patent No.: US 9,117,762 B2
(45) Date of Patent: Aug. 25, 2015

(54) METHODS OF FABRICATING FINE PATTERNS AND PHOTOMASK SETS USED THEREIN

(71) Applicant: SK Hynix Inc., Icheon-si Gyeonggi-do (KR)

(72) Inventor: Hye Jin Shin, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 41 days.

(21) Appl. No.: 13/719,197

(22) Filed: Dec. 18, 2012

(65) Prior Publication Data

US 2014/0030894 A1    Jan. 30, 2014

(30) Foreign Application Priority Data

Jul. 30, 2012  (KR) ........................ 10-2012-0083538

(51) Int. Cl.
*G03F 7/36* (2006.01)
*H01L 21/308* (2006.01)
*H01L 21/033* (2006.01)
*H01L 27/105* (2006.01)

(52) U.S. Cl.
CPC .......... *H01L 21/308* (2013.01); *H01L 21/0337* (2013.01); *H01L 27/1052* (2013.01)

(58) Field of Classification Search
USPC .................................................. 430/314, 394
See application file for complete search history.

(56) References Cited

U.S. PATENT DOCUMENTS

| 2004/0110092 | A1 | 6/2004 | Lin |
| 2007/0015088 | A1 | 1/2007 | Lin |
| 2011/0124194 | A1* | 5/2011 | Kwon et al. ................. 438/692 |

* cited by examiner

*Primary Examiner* — Daborah Chacko Davis
(74) *Attorney, Agent, or Firm* — William Park & Associates Ltd.

(57) ABSTRACT

Photo mask sets and methods of fabricating fine patterns are provided. The method includes forming a first layer having a first main pattern part and a first dummy pattern part on a base layer, forming a second layer on the first layer, etching the first layer using the second layer as an etch mask to form a third main pattern part composed of a remaining portion of the first main pattern part and to remove the first dummy pattern part, and removing the second layer. The second layer is formed to have a second main pattern part exposing portions of the first main pattern part and to have a second dummy pattern part exposing the first dummy pattern part.

8 Claims, 11 Drawing Sheets

METHODS OF FABRICATING FINE PATTERNS AND PHOTOMASK SETS USED THEREIN

CROSS-REFERENCES TO RELATED APPLICATIONS

The present application claims priority under 35 U.S.C 119(a) to Korean Application No. 10-2012-0083538, filed on Jul. 30, 2012, in the Korean Intellectual Property Office, which is incorporated herein by reference in its entirety as set forth in full.

BACKGROUND

1. Field of the Invention

Embodiments of the present disclosure generally relate to methods of fabricating a semiconductor device and photo mask sets used therein and, more particularly, to methods of fabricating fine patterns and photo mask sets used therein.

2. Description of the Related Art

Each of the semiconductor devices, for example, semiconductor memory devices include a cell region having a plurality of memory cells and a peripheral circuit region surrounding the cell region. As the semiconductor memory devices become more highly integrated, sizes of circuit patterns constituting the semiconductor devices have been reduced. If the sizes of the circuit patterns are reduced, a difference in the pattern density and size between the cell region including fine patterns and the peripheral circuit region surrounding the cell region may abruptly increase. In such a case, the fine patterns located at edges of the cell region may be abnormally formed to have deformed configurations due to a proximity effect during a lithography process and an etching process for forming the fine patterns. That is, it may be difficult to control the critical dimensions (CDs) of the fine patterns located at the edges of the cell region. Therefore, process margins of the lithography process and the etching process may be reduced. Accordingly, dummy patterns may be disposed in a border region between the cell region and the peripheral circuit region in order to improve the CD controllability and the process margin to the fine patterns located at the edges of the cell region.

The number of the dummy patterns may increase to improve the CD uniformity of the fine patterns in the cell region. However, increase of the number of the dummy patterns may cause degradation of the integration density of the semiconductor devices. As a result, there may be some limitations in improving the CD uniformity of the fine patterns in the cell region.

SUMMARY

Various embodiments may be directed to methods of fabricating fine patterns and photo mask sets used therein.

According to various embodiments, a method of fabricating fine patterns includes forming a first layer having a first main pattern part and a first dummy pattern part on a base layer, forming a second layer on the first layer, etching the first layer using the second layer as an etch mask to form a third main pattern part composed of a remaining portion of the first main pattern part and to remove the first dummy pattern part, and removing the second layer. The second layer is formed to have a second main pattern part exposing portions of the first main pattern part and to have a second dummy pattern part exposing the first dummy pattern part.

According to further embodiments, a method of fabricating fine patterns includes forming a first layer having an array of first main patterns and an array of first dummy patterns on a base layer, forming a second layer on the first layer, the second layer being formed to have an array of second main patterns exposing portions of the first main patterns and to have an array of second dummy patterns exposing the array of the first dummy patterns, etching the first layer using the second layer as an etch mask to form an array of third main patterns composed of remaining portions of the first main patterns and to remove the array of the first dummy patterns, and removing the second layer.

According to further embodiments, a photo mask set used in formation of fine patterns includes a first mask having a first layout that includes a first main pattern part and a first dummy pattern part, and a second mask having a second layout that includes a second main pattern part and a second dummy pattern part. When the first and second masks are aligned with each other, the second main pattern part exposes portions of the first main pattern part and the second dummy pattern part has a reverse image of the first dummy pattern part.

In various embodiments, the first main pattern part may define a plurality of first opening parts which are arrayed in a matrix form therein.

In various embodiments, the second main pattern part may define a plurality of second opening parts disposed between the first opening parts in a top plan view.

In various embodiments, the second dummy pattern part may have a reverse image of the first dummy pattern part.

BRIEF DESCRIPTION OF THE DRAWINGS

Embodiments of the inventive concept will become more apparent in view of the attached drawings and accompanying detailed description, in which.

DETAILED DESCRIPTION OF THE EMBODIMENTS

Various embodiments may employ dummy patterns to perform a lithography process and an etching process, and may provide methods of fabricating fine patterns without any residues of the dummy patterns.

Various embodiments will be described more fully hereinafter with reference to the accompanying drawings.

In the following embodiments, it will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the inventive concepts. As used herein the term "and/or" includes any and all combinations of one or more of the associated listed items.

It will be also understood that when an element is referred to as being located "under", "beneath," "below", "lower," "on", "over", "above," "upper", "side" or "aside" another element, it can be directly contact the other element, or at least one intervening element may also be present therebetween. Accordingly, the terms such as "under", "beneath," "below", "lower," "on", "over", "above," "upper", "side" "aside" and the like which are used herein are for the purpose of describing particular embodiments only and are not intended to limit the inventive concepts.

In addition, spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device (or a package) in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

It will be further understood that the term "semiconductor device" used herein may correspond to a semiconductor memory device including integrated circuits, for example, a dynamic random access memory (DRAM) device, a flash memory device, a resistive random access memory (ReRAM) device (e.g., a phase changeable random access memory device or a magnetic random access memory device) or the like.

Various embodiments of the inventive concepts may also be applicable to display devices, solar cell devices, optical communication devices, or the like.

Figure 1:
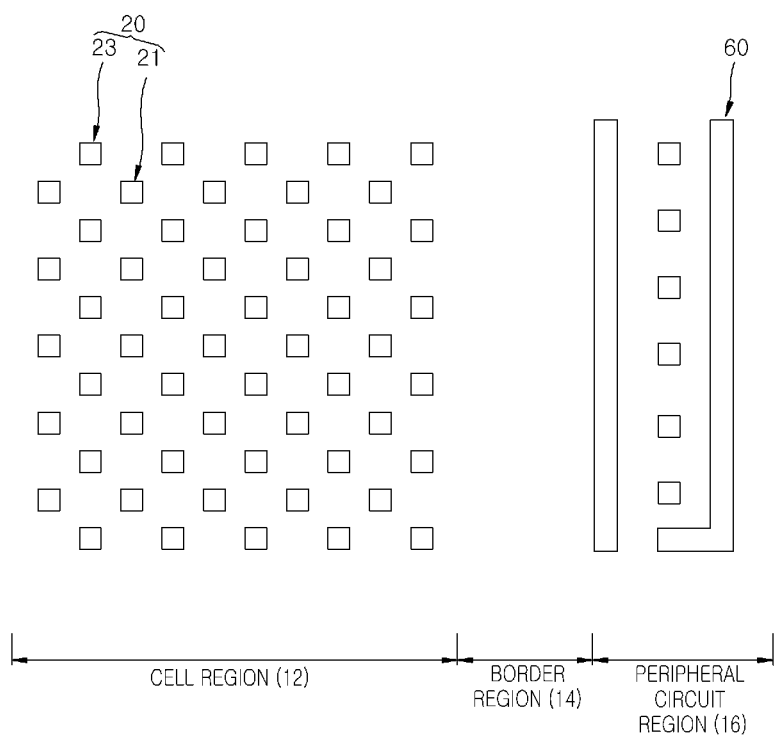
FIGS. 1, 2 and 3 are plan views illustrating arrays of fine patterns of a photo mask set according to an embodiment.
Figure 2:
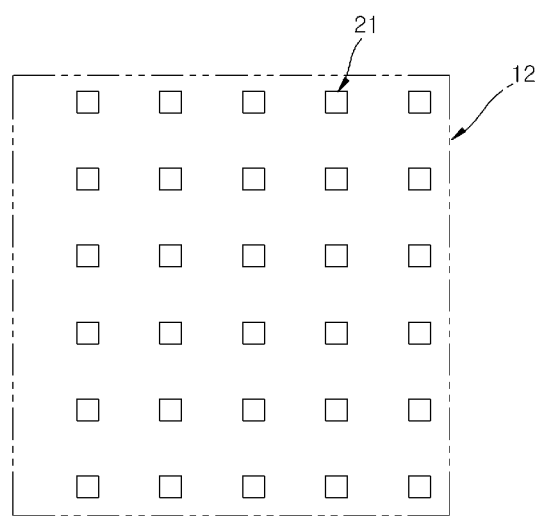
Figure 3:
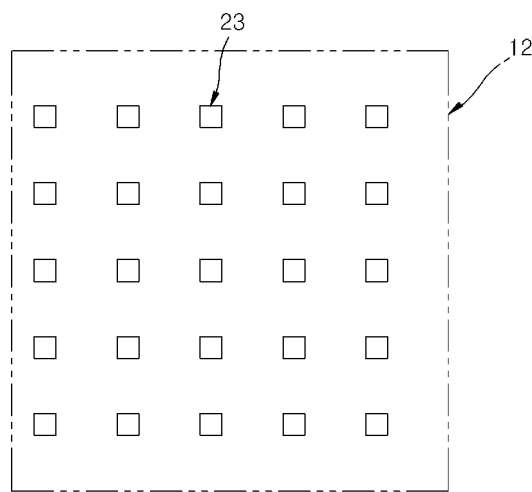

FIGS. 1, 2, and 3 are plan views illustrating arrays of fine patterns of a photo mask set according to an embodiment. Referring to FIG. 1, cell pattern features 20 such as contact structures or pillar structures may be arrayed in a cell region 12 of a semiconductor memory device, for example, a DRAM device, a phase changeable random access memory (PCRAM) device or a magnetic random access memory (MRAM) device. If the cell pattern features 20 correspond to bit line contact holes of the DRAM device, the cell pattern features 20 may have substantially circular shapes or substantially rectangular shapes with substantially the same size and peripheral pattern features 60 constituting peripheral circuits may be disposed in a peripheral circuit region 16 surrounding the cell region 12 in which the cell pattern features 20 are arrayed. A border region 14 between the cell region 12 and the peripheral circuit region 16 may have a certain width or a certain area to suppress or minimize an interference phenomenon which is occurred during formation of the cell pattern features 20 (arrayed in a matrix form) and the peripheral pattern features 60.

As the sizes of the cell pattern features 20 and spaces between the cell pattern features 20 are reduced, it may be difficult to directly transfer the cell pattern features 20 onto a semiconductor substrate without any pattern distortions using a single exposure technology as a lithography process. Thus, a double patterning technology (DPT) may be used in formation of patterns corresponding to the cell pattern features 20 to improve a resolution limit of the lithography process. To use the double patterning technology (DPT), an array of first cell pattern features 21 illustrated in FIG. 2 may be extracted from a layout of the cell pattern features 20 disposed in the cell region 12 and an array of second cell pattern features 23 illustrated in FIG. 3 may be extracted from a layout of the cell pattern features 20 disposed in the cell region 12. The first cell pattern features 21 may be transferred on the substrate in a first patterning process, and the second cell pattern features 23 may be transferred on the substrate in a second patterning process. The first and second cell pattern features 21 and 23 may be extracted such that a pitch size of the first cell pattern features 21 and a pitch size of the second cell pattern features 23 are greater than a pitch size of the cell pattern features 20. In an embodiment, the first cell pattern features 21 may be disposed at intersections of odd rows and odd columns, and the second cell pattern features 23 may be disposed at intersections of even rows and even columns. Although FIGS. 1, 2, and 3 illustrate substantially island-shaped hole patterns as the cell pattern features 20, the embodiments are not limited thereto. For example, the cell pattern features 20 may be replaced with line-shaped groove patterns disposed in parallel between line patterns.

Figure 4:
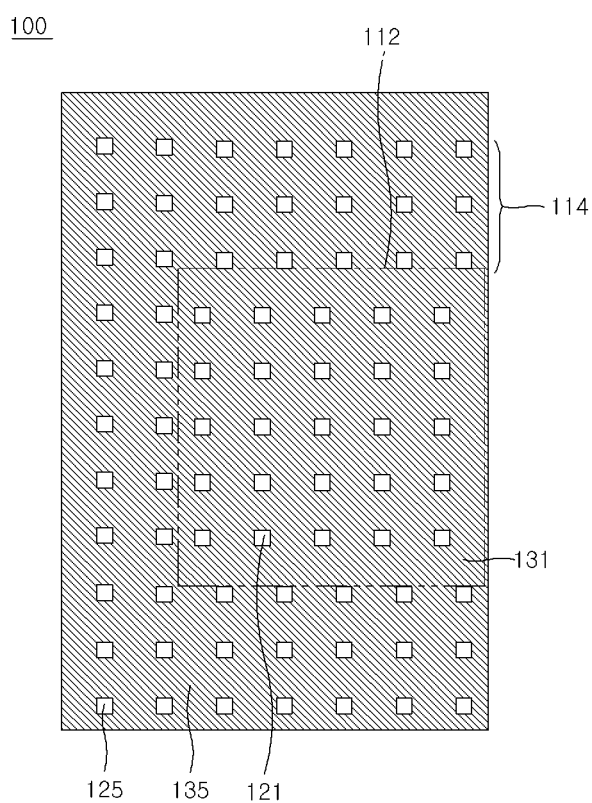
FIGS. 4 and 5 are plan views illustrating photo masks of a photo mask set according to an embodiment.
Figure 5:
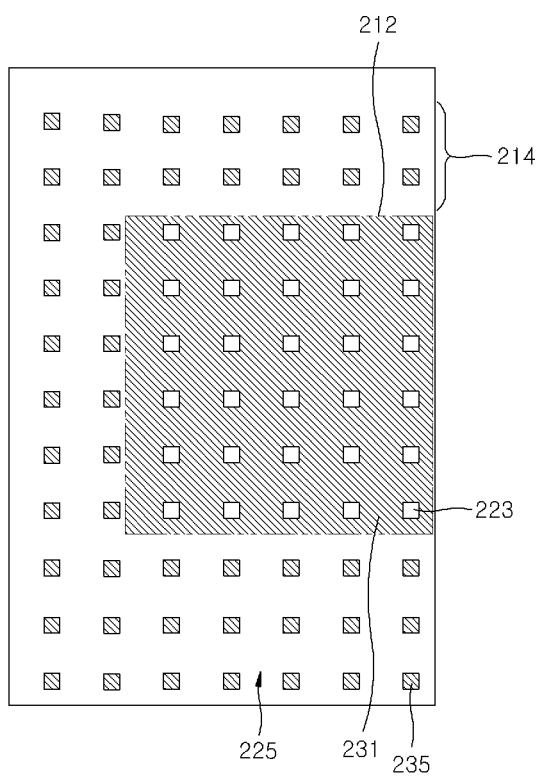

FIGS. 4 and 5 are plan views illustrating photo masks of a photo mask set according to an embodiment. FIG. 4 illustrates a first layout of a first mask 100 which is transferred on a first layer using a first lithography process in the double patterning technology (DPT). The first layout of the first mask 100 may include a first main pattern part 131 that employs the first cell pattern features (21 of FIG. 2) as first opening parts 121 therein. The first layout of the first mask 100 may include a first region 112 in which the first main pattern part 131 is positioned and a second region 114 in which a first dummy pattern part 135 is positioned. The second region 114 may be disposed to substantially surround the first region 112. That is, the first region 112 may correspond to the cell region 12 of FIG. 1, and the second region 114 may correspond to the border region 14 and/or the peripheral circuit region 16 of FIG. 1.

The first dummy pattern part 135 may be provided to define first dummy opening parts 125 corresponding to first dummy features. The first dummy opening parts 125 may have substantially the same configuration as the first opening parts 121 in size, pitch, and shape. In various embodiments, the size and pitch of the first dummy opening parts 125 may be greater or less than the size and pitch of the first opening parts 121. In various embodiments, the shape of the first dummy opening parts 125 may be different from that of the first opening parts 121. According to the present embodiment, each of the first dummy opening parts 125 may substantially have an island-shaped hole pattern, but not limited thereto. For example, if the cell pattern features (20 of FIG. 1) have line-shaped groove patterns instead of the island-shaped hole patterns, the first dummy opening parts 125 may also have line-shaped groove patterns. The first layout may be drawn on a mask substrate, thereby forming a first mask 100 including mask patterns. The mask patterns of the first mask 100 may be formed of an opaque layer (e.g., a chrome layer), a photo attenuation layer (in case of a phase shift mask), or a light absorption layer (in case of an extreme UV mask).

FIG. 5 illustrates a second layout of a second mask 200 which is transferred on a second layer, which is tacked on the first layer, using a second lithography process in the double patterning technology (DPT). The second layout of the second mask 200 may include a second main pattern part 231 that employs the second cell pattern features (23 of FIG. 3) as second opening parts 223 therein. When the first and second masks 100 and 200 are aligned to overlap with each other, the second opening parts 223 may be disposed to expose portions of the first main pattern part (131 of FIG. 4) between the first opening parts 121. The second layout of the second mask 200 may include a first region 212 in which the second main pattern part 231 is positioned and a second region 214 in which second dummy pattern parts 235 are positioned. The second region 214 may be disposed to substantially surround the first region 212. That is, the first region 212 may correspond to the cell region 12 of FIG. 1, and the second region 214 may correspond to the border region 14 and/or the peripheral circuit region 16 of FIG. 1.

The second dummy pattern parts 235 may be generated to have a reverse image of the first dummy pattern part (135 of FIG. 4). That is, the second dummy pattern parts 235 may overlap with the first dummy opening parts 125 of FIG. 4, thereby having island-shaped pillar patterns. The second dummy pattern parts 235 may be provided to define a second dummy opening part 225 that overlaps and exposes the first dummy pattern part 135. The first dummy pattern part 135 and the second dummy pattern parts 235 having a reverse image of the first dummy pattern part 135 may have the same field polarity (e.g., one of a clear field and a dark field). For example, if the first dummy pattern part 135 is formed of an opaque layer, the second dummy pattern parts 235 may also be formed of an opaque layer. Accordingly, the first dummy pattern part 135 may act as a substantial dummy pattern of the first mask 100, and the second dummy pattern parts 235 may act as substantial dummy patterns of the second mask 200. The first dummy pattern part 135 may be fabricated to have a reverse image of the second dummy pattern parts 235, as described above. Thus, in various embodiments, the first dummy pattern part 135 defining the first dummy opening parts 125 may be employed in the second region 214 of the second mask 200, and the second dummy pattern parts 235 defined by the second dummy opening part 225 may be employed in the second region 114 of the first mask 100.

The second dummy pattern parts 235 may have substantially the same size, pitch, and shape as the second opening parts 223. However, the field polarity of the second dummy pattern parts 235 may be opposite to the field polarity of the second opening parts 223. In various embodiments, the size and pitch of the second dummy pattern parts 235 may be greater or less than the size and pitch of the second opening parts 223. In various embodiments, the shape of the second dummy pattern parts 235 may be different from that of the second opening parts 223. According to the present embodiment, each of the second dummy pattern parts 235 may have an island-shaped pattern, but not limited thereto. For example, if the cell pattern features (20 of FIG. 1) have line-shaped groove patterns instead of the island-shaped hole patterns, the second dummy pattern parts 235 may also have line-shaped patterns. The second layout may be drawn on another mask substrate, thereby forming a second mask 200 including mask patterns. The mask patterns of the second mask 200 may be formed of an opaque layer (e.g., a chrome layer), a photo attenuation layer (in case of a phase shift mask), or a light absorption layer (in case of an extreme UV mask).

Methods of fabricating fine patterns using a photo mask set according to an embodiment are described hereinafter with reference to FIGS. 6 to 11.

Figure 6:
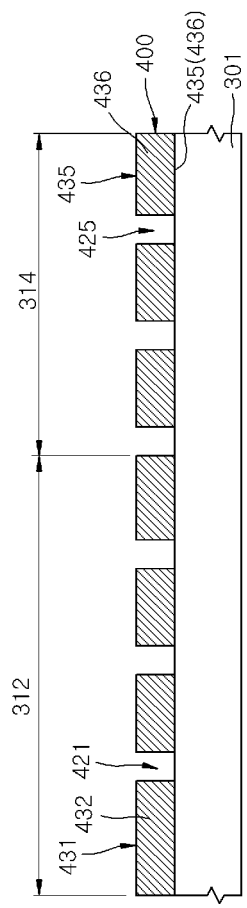
FIGS. 6 to 11 are cross sectional views illustrating a method of fabricating fine patterns according to an embodiment.

Referring to FIG. 6, a first layer 400 may be formed on a base layer 301. The first layer 400 may be patterned in a subsequent lithography process employing a double patterning technology (DPT). The base layer 301 may be a semiconductor substrate on which integrated circuits are formed or a material layer (e.g., a conductive layer or an insulation layer) which is etched in a subsequent process employing a double patterning technology (DPT). The base layer 301 may include a first region 312 corresponding to the cell region 12 of FIG. 1 and a second region 314 corresponding to the border region 14 of FIG. 1. That is, the second region 314 may substantially surround the first region 312.

After formation of the first layer 400, a first patterning process may be applied to the first layer 400. The first patterning process may include a first lithography process and an etching process preceded by the first lithography process. The first lithography process may be performed to transfer the mask patterns in the first mask 100 of FIG. 4. The first layer 400 may include a hard mask layer to be etched in a subsequent etching process and/or a first photoresist layer to be exposed and developed during the first lithography process. The first layer 400 may be patterned by the first patterning process, thereby forming a first main pattern part 431 in the first region 312 and a first dummy pattern part 435 in the second region 314. The first main pattern part 431 and the first dummy pattern part 435 may be formed by transferring the first mask 100 (see FIG. 4) including the first main pattern part 131 and the first dummy pattern part 135. Thus, the first main pattern part 431 and the first dummy pattern part 435 may be formed to have the shapes of the first main pattern part 131 and the first dummy pattern part 135, respectively.

The first main pattern part 431 may be formed to include a plurality of first main patterns 432 and to define first opening parts 421 corresponding to the first opening parts 121 of the first mask 100 shown in FIG. 4. Thus, the first opening parts 421 may be formed to have island-shaped holes corresponding to the first cell pattern features 21 of FIGS. 1 and 2. The plurality of first main patterns 432 constituting the first main pattern part 431 may be physically connected to each other or may be separated from each other when viewed from a top plan view.

The first dummy pattern part 435 may be formed to include a plurality of first dummy patterns 436 and to define first dummy opening parts 425 corresponding to the first dummy opening parts 125 of the first mask 100 shown in FIG. 4. The plurality of first dummy patterns 436 constituting the first dummy pattern part 435 may be physically connected to each other or may be separated from each other when viewed from a top plan view.

The first opening parts 421 defined by the first main pattern part 431 may maintain their pattern regularity and uniformity throughout the first region 312 because of the presence of the first dummy opening parts 425 defined by the first dummy pattern part 435. That is, the first dummy opening parts 425 arrayed in the second region 314 may suppress and/or prevent the profiles of the first opening parts 421 arrayed in the edges of the first region 312 from being abnormally deformed. Accordingly, the first opening parts 421 arrayed in the edges of the first region 312 may be formed to have substantially the same profile and size as the first opening parts 421 arrayed in a central portion of the first region 312 because of the presence of the first dummy opening parts 425 arrayed in the second region 314 adjacent to the edges of the first region 312.

Figure 7:
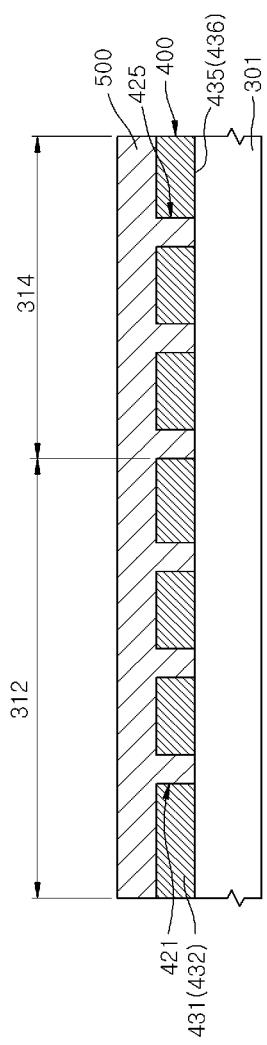

Referring to FIG. 7, a sacrificial layer 500 may be formed to substantially cover the patterned first layer 400 and to substantially fill the first opening parts 421 and the first dummy opening parts 425. The sacrificial layer 500 may be formed to have a flat top surface. When the first layer 400 is formed to include a first photoresist layer, the sacrificial layer 500 may be formed to protect the first photoresist layer (e.g., the first main pattern part 431 and the first dummy pattern part 435) during a second patterning process for patterning a second layer to be formed in a subsequent process step. The sacrificial layer 500 may be removed in a subsequent process. Thus, the sacrificial layer 500 may be formed of a material layer having an etch selectivity with respect to the first layer 400. For example, the sacrificial layer 500 may be formed of a spin on carbon (SOC) layer. In various embodiments, the sacrificial layer 500 may be formed to include an amorphous carbon layer, a silicon oxide layer, a silicon nitride layer, or a silicon oxynitride layer.

Figure 8:
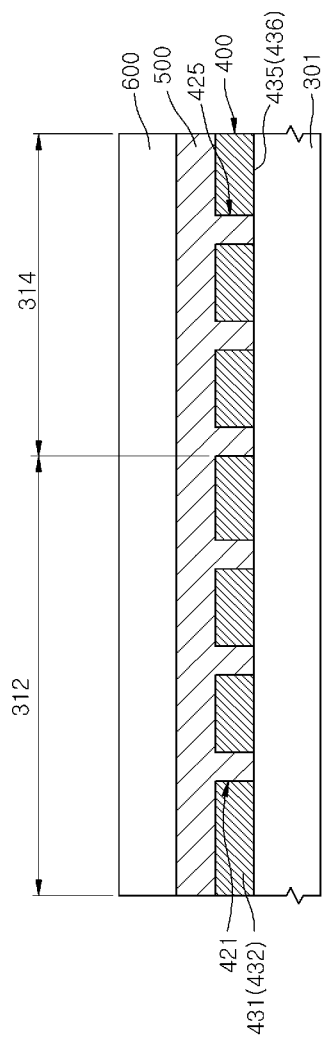

Referring to FIG. 8 (see also FIGS. 6 and 7), a second layer 600 may be formed on the sacrificial layer 500. The second layer 600 may be patterned using a double patterning technology (DPT) in a subsequent process step. The second layer 600 may include a hard mask layer to be etched in a subsequent etching process and/or a second photoresist layer to be exposed and developed in a subsequent lithography process.

Figure 9:
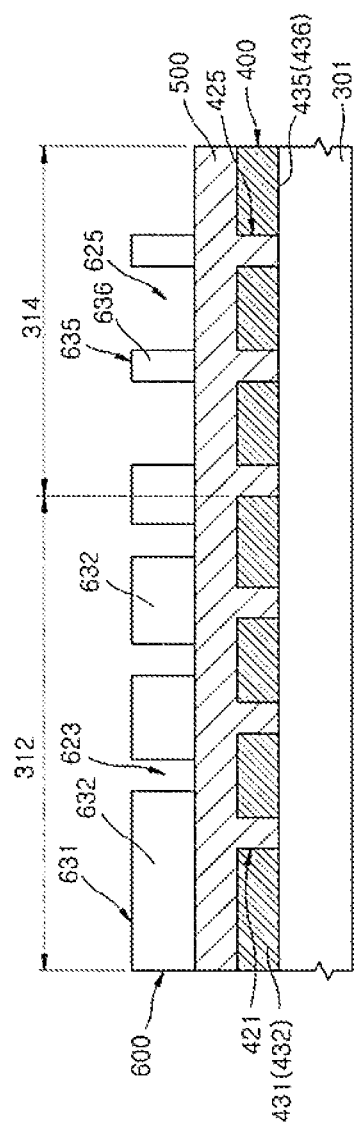

Referring to FIG. 9 (see also FIGS. 6 to 8), the second layer 600 may be patterned by a second patterning process, thereby forming a second main pattern part 631 in the first region 312 and second dummy pattern parts 635 in the second region 314. The second patterning process may include a second lithography process and an etching process preceded by the second lithography process. The second main pattern part 631 and the second dummy pattern parts 635 may be formed by transferring the second mask (200 of FIG. 5) including the second main pattern part 231 and the second dummy pattern parts 235 of the second mask 200. Thus, the second main pattern part 631 and the second dummy pattern parts 635 may be formed to have the shapes of the second main pattern part 231 and the second dummy pattern parts 235, respectively.

The second main pattern part 631 may be formed to include a plurality of second main patterns 632 and to define second opening parts 623 corresponding to the second opening parts 223 of the second mask 200 shown in FIG. 5. Thus, the second opening parts 623 may be formed to have island-shaped holes corresponding to the second cell pattern features 23 of FIGS. 1 and 3. The plurality of second main patterns 632 constituting the second main pattern part 631 may be physically connected to each other or may be separated from each other when viewed from a top plan view.

The second dummy pattern parts 635 may be formed to include a plurality of second dummy patterns 636 and to define a second dummy opening part 625 corresponding to the second dummy opening part 225 of the second mask 200 shown in FIG. 5. The plurality of second dummy patterns 636 constituting the second dummy pattern parts 635 may be physically connected to each other or may be separated from each other when viewed from a top plan view. If the second dummy patterns 636 may be formed to have island-shaped patterns separated from each other, the second dummy opening part 625 may be formed to have a matrix-shaped hole pattern.

The second opening parts 623 defined by the second main pattern part 631 may maintain their pattern regularity and uniformity throughout the first region 312 because of the presence of the second dummy pattern parts 635 defined by the second dummy opening part 625. That is, the second dummy pattern parts 635 arrayed in the second region 314 may suppress and/or prevent the profiles of the second opening parts 623 arrayed in the edges of the first region 312 from being abnormally deformed. Accordingly, the second opening parts 623 arrayed in the edges of the first region 312 may be formed to have substantially the same profile and size as the second opening parts 623 arrayed in a central portion of the first region 312 because of the presence of the second dummy pattern parts 635 arrayed in the second region 314 adjacent to the edges of the first region 312.

The second opening parts 623 defined by the second main pattern part 631 (or the second main patterns 632) may be formed at positions between the first opening parts 421, thereby overlapping with portions of the first main pattern part 431 in a top plan view. If the process for forming the sacrificial layer 500 is omitted, the second opening parts 623 may be formed to directly expose portions of the first main pattern part 431. That is, the second main pattern part 631 may be formed such that second opening parts 623 are arrayed to expose portions of the first main pattern part 431.

The second dummy opening part 625 defined by the second dummy pattern parts 635 (or the second dummy patterns 636) may be formed to fully overlap with the first dummy pattern part 435 (or the first dummy patterns 436) in a top plan view. If the process for forming the sacrificial layer 500 is omitted, the second dummy opening part 625 may be formed to directly expose an entire top surface of the first dummy pattern part 435. That is, the second dummy opening part 625 may be formed to have a reverse image of the first dummy pattern part 435.

Figure 10:
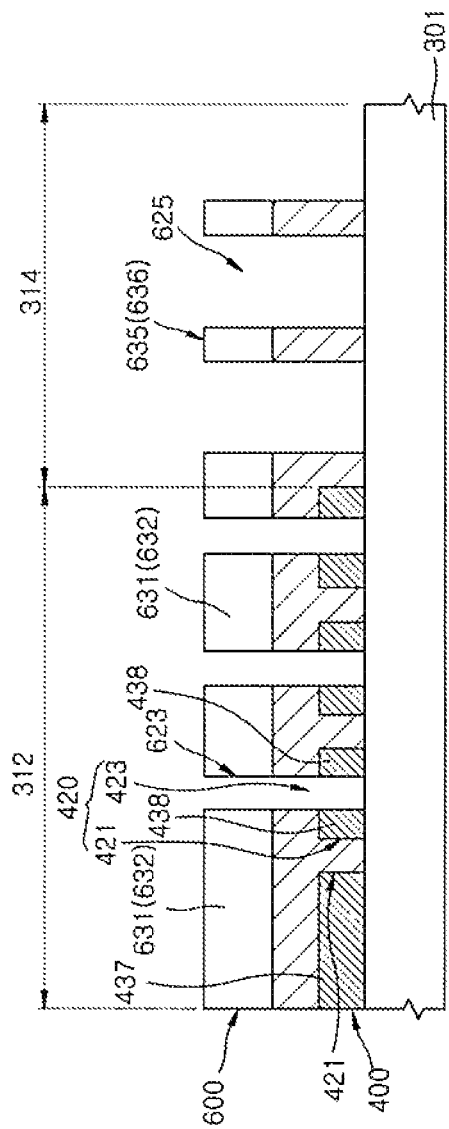

Referring to FIG. 10 (see also FIGS. 6 to 9), the sacrificial layer 500 and the first layer 400 may be etched using the second main pattern part 631 and the second dummy pattern parts 635 as etch masks.

After the sacrificial layer 500 and the first layer 400 are etched, fourth opening parts 423 substantially vertically aligned with the second opening parts 623 may be formed in the first layer 400 between the first opening parts 421. That is, the first layer 400 may be patterned to form third main pattern part 437 (or third main patterns 438) defining the first and fourth opening parts 421 and 423. The first and fourth opening parts 421 and 423 may constitute third opening parts 420 corresponding to the cell pattern features 20 shown in FIG. 1.

In addition, when the sacrificial layer 500 and the first layer 400 are etched, the sacrificial layer 500 may be etched to expose an entire top surface of the first dummy pattern part 435 in the second region 314 and the first dummy pattern part 435 may be completely removed. As a result, the first dummy pattern part 435 (or the first dummy patterns 436) may be merely used to suppress a proximity effect during the first patterning process for forming the first opening parts 421 and may be completely removed after formation of the first opening parts 421.

Figure 11:
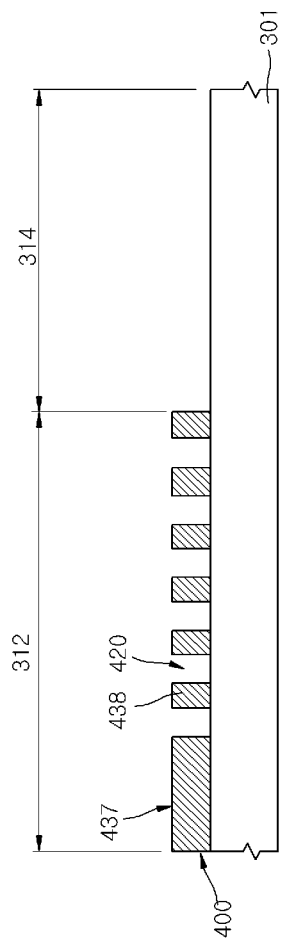

Referring to FIG. 11 (see also FIGS. 6-10), remaining portions of the second layer 600 and the sacrificial layer 500 may be removed to expose the third main pattern part 437 defining the third opening parts 420. As a result, all the dummy patterns in the second region 314 may be completely removed.

As described above, the dummy patterns in the second region 314 are completely removed without any residues thereof after formation of the third opening parts 420 in the first region 312. Thus, the second region 314 may be utilized to form other main patterns. That is, because the number of the first and second dummy patterns (436 of FIGS. 6 and 636 of FIG. 9) can be increased without any limitations to a width and/or an area of the border region (14 of FIG. 1), thereby improving the pattern uniformity in the cell region. Therefore, highly integrated semiconductor devices can be realized without any pattern distortions in the cell region.

The embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A method of fabricating fine patterns, the method comprising:
   forming a first layer having a first main pattern part and a first dummy pattern part on a base layer, wherein the first main pattern part defines a plurality of first opening parts and
   wherein the first dummy pattern part defines a plurality of first dummy opening parts;

forming a second layer on the first layer, the second layer being formed to have a second main pattern part and a second dummy pattern part, wherein the second main pattern part defining a plurality of second opening parts which expose portions of the first main pattern part between the first opening parts, and wherein the second dummy pattern part is formed to fully overlap the first dummy opening parts, and wherein the second dummy pattern part is formed to have a reverse image of the first dummy pattern part;

etching the first layer using the second layer as an etch mask to form a third main pattern part composed of a remaining portion of the first main pattern part and to remove the first dummy pattern part; and removing the second layer.

2. The method of claim 1, further comprising forming a sacrificial layer that covers the first layer before the second layer is formed.

3. The method of claim 2, wherein the sacrificial layer is formed to include a spin on carbon (SOC) layer having an etch selectivity with respect to the first layer.

4. The method of claim 2, wherein the sacrificial layer is formed to include an amorphous carbon layer, a silicon oxide layer, a silicon nitride layer, or a silicon oxynitride layer.

5. The method of claim 1, the first opening parts are arrayed in a matrix form therein.

6. The method of claim 1, wherein each of the first and second opening parts is formed to substantially have an island-shaped hole pattern or a line-shaped groove pattern.

7. The method of claim 1:

wherein the second opening parts defined by the second main pattern part are transferred into the first layer to form fourth opening parts when the first layer is etched using the second layer as an etch mask; and wherein the first opening parts and the fourth opening parts constitute third opening parts which are regularly arrayed in the third main pattern part to have a substantially uniform pitch, and the third opening parts have substantially the same size and shape.

8. The method of claim 1, wherein each of the plurality of dummy opening parts is formed to substantially have an island-shaped hole pattern or a line-shaped groove pattern.

* * * * *